United States Patent
Burnham et al.

(10) Patent No.: US 6,521,977 B1
(45) Date of Patent: Feb. 18, 2003

(54) DEUTERIUM RESERVOIRS AND INGRESS PATHS

(75) Inventors: Jay Burnham, E. Fairfield, VT (US); Eduard A. Cartier, New York, NY (US); Thomas G. Ference, Essex Junction, VT (US); Steven W. Mittl, Essex, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/489,277

(22) Filed: Jan. 21, 2000

(51) Int. Cl.[7] .................... H01L 23/58; H01L 29/40; H01L 21/00; H01L 21/3205; H01L 21/4763

(52) U.S. Cl. ............... 257/649; 257/640; 257/618; 257/622; 257/629; 257/774; 257/761; 438/98; 438/162; 438/240; 438/407; 438/683; 438/686; 438/624; 438/625; 438/589; 438/618; 438/622; 438/627; 438/629; 438/637; 438/648; 438/650; 438/675

(58) Field of Search .................. 257/640, 618, 257/622, 629, 649, 774, 761–766; 438/98, 162, 240, 407, 683, 686, 624, 625, 589, 618, 622, 627, 629, 637, 648, 650, 675

(56) References Cited

U.S. PATENT DOCUMENTS

| 5,250,446 A | | 10/1993 | Osawa et al. | |
|---|---|---|---|---|
| 5,487,094 A | | 1/1996 | Sudo | |
| 5,500,558 A | * | 3/1996 | Hayashide | 257/758 |
| 5,689,140 A | * | 11/1997 | Shoda | 257/774 |
| 5,711,998 A | | 1/1998 | Sufflebotham | |
| 5,798,555 A | | 8/1998 | Mishra et al. | |
| 5,830,575 A | | 11/1998 | Warren et al. | |
| 5,872,387 A | * | 2/1999 | Lyding et al. | 257/607 |
| 5,972,765 A | * | 10/1999 | Clark et al. | 438/308 |
| 6,025,226 A | * | 2/2000 | Gambino et al. | 438/244 |
| 6,114,734 A | * | 9/2000 | Eklund | 257/410 |
| 6,143,634 A | * | 11/2000 | Wallace et al. | 438/585 |
| 6,187,665 B1 | * | 2/2001 | Chetlur et al. | 438/627 |
| 6,242,354 B1 | * | 6/2001 | Thomas | 438/696 |
| 6,262,485 B1 | * | 7/2001 | Thakur et al. | 257/757 |
| 6,281,110 B1 | * | 8/2001 | Kizilyalli et al. | 438/622 |
| 2002/0031920 A1 | * | 3/2002 | Lyding et al. | 438/795 |

OTHER PUBLICATIONS

Thoma s Ference, "The Combined Effects of Deuterium Anneals and Deuterated Barrier–Nitride Processing on Hot–Electron Degredation in MOSFET's", IEEE 1999, vol. 46 No. 4.*

* cited by examiner

*Primary Examiner*—Albert W. Paladini
*Assistant Examiner*—James Mitchell
(74) *Attorney, Agent, or Firm*—Whitham, Curtis & Christofferson, P.C.; Mark F. Chadurjian (57) ABSTRACT

Semiconductor structures are provided with on-board deuterium reservoirs or with deuterium ingress paths which allow for diffusion of deuterium to semiconductor device regions for passivation purposes. The on-board deuterium reservoirs are in the form of plugs which extend through an insulating layer and a deuterium barrier layer to the semiconductor substrate, and are preferably positioned in contact with a shallow trench oxide which will allow diffusion of deuterium to the semiconductor devices. The deuterium ingress paths extend through thin film layers from the top or through the silicon substrate. The latter include shallow trench isolations formed in a semiconductor substrate which are adjacent and connected to semiconductor devices formed in the semiconductor substrate, and where the back portion of the semiconductor substrate has been polished or ground down to the bottom of the shallow trench isolation, thereby allowing deuterium, during an anneal, to diffuse from the back through the shallow trench isolation to the semiconductor devices in the semiconductor substrate.

20 Claims, 8 Drawing Sheets

DEUTERIUM RESERVOIRS AND INGRESS PATHS

FIELD OF THE INVENTION

The present invention generally relates to semiconductor manufacturing techniques which utilize deuterium passivation.

BACKGROUND

Semiconductor manufacturing has moved towards the production of smaller and smaller devices. As device dimensions continue to shrink, hot electrons play an increasing role in degrading device performance. This decrease in device performance is attributable to hot electrons pulling away hydrogen from the silicon lattice and creating unwanted interface states.

To attempt to increase device performance, some processes employ a late-stage hydrogenation procedure in which the device is hydrogenated near the end of processing to introduce/reintroduce hydrogen atoms to the polysilicon grain boundaries and to the Si—$SiO_2$ interface. Some conventional processes perform late stage hydrogenation by heating a completed device to 400° C., and exposing the device to hydrogen, with or without plasma. In these processes, the hydrogen diffuses through the device layers and eventually reaches the polysilicon gate dielectric interface to provide passivation. A problem with this approach is that the hydrogenation step is extremely slow or not possible due to impermeable barriers, taking in some instances more than ten hours to perform per substrate. Thus, improved device performance comes at the expense of reduced process throughput. In addition, the hydrogen annealing typically does not passivate 100% of the defects.

U.S. Pat. No. 5,711,998 to Shufflebotham describes a method of hydrogenating a polycrystalline silicon in an electrical device including the step of placing a substrate having a polysilicon component in a radio frequency induced low-pressure, high-density plasma reactor. The method further includes introducing a gas including at least hydrogen or deuterium into the reactor. Hydrogenation of the polysilicon component is accomplished by striking a plasma in the RF induced low pressure, high-density plasma reactor under conditions that promote hydrogenation of the polysilicon component.

U.S. Pat. 5,830,575 to Warren discloses a memory device that is constructed as a silicon-silicon dioxide-silicon layered structure. Protons are introduced laterally into the structure through the exposed edges of the silicon dioxide layer during a high temperature anneal in an atmosphere containing hydrogen gas.

U.S. Pat. No. 5,250,446 to Osawa et al. describes a process where a semiconductor substrate is exposed to a mixture of charged particles including hydrogen ions, deuterium ions, and molecular hydrogen and deuterium. Due to differences in mass, the deuterium ions are introduced into the substrate at a different depth than the hydrogen ions.

Passivating with deuterium, as compared to hydrogen, produces improved long term hot electron resistance. The excitation lifetime of deuterium is lower than hydrogen; therefore, the chance of being bombarded by a second electron while excited and escaping from the silicon lattice is significantly less for deuterium. However, a deuterium anneal performed at the beginning of a manufacturing process to deuterate a gate oxide/silicon interface may not provide the performance characteristics desired. This is because subsequent processing steps can degrade deuterium levels. Therefore, it would be beneficial to provide a process which allows the deuterium to remain in the device after all processing is complete.

SUMMARY OF THE INVENTION

It is an object of the invention to provide semiconductor substrates with deuterium ingress paths closely positioned to semiconductor devices which allow passivation to be easily performed towards the end of processing.

It is another object of the invention to provide methods for producing semiconductor substrates with deuterium reservoirs closely positioned to semiconductor devices.

It is another object of the invention to provide methods for annealing to be performed at the end of the manufacturing process so as to allow optimum deuterium levels to be obtained.

It is another object of the invention to provide structures of deuterium reservoirs in semiconductor devices for deuterium passivation during semiconductor manufacturing.

It is another object of the invention to provide an ingress path through a barrier layer to allow deuterium to enter into the gate region of a device and then to cap that ingress path so as to avoid ionic contamination.

It is yet another object of the invention to provide a deuterium ingress path through a back of the semiconductor wafer by providing trenches in the semiconductor from the front filled with a material through which deuterium can diffuse and backside grinding or polishing to expose the base of one or more of these regions from the back.

According to one embodiment of the invention, deuterium reservoir plugs are formed in a semiconductor structure and serve as a source of deuterium for passivating semiconductor devices within the semiconductor structure. The semiconductor structure includes a substrate in which one or more semiconductor devices are formed. A barrier layer is applied over the substrate and is overcoated with an insulator material. The barrier layer is made from a material which prevents or resists deuterium diffusion therethrough. Silicon nitride is an example of a suitable barrier material. The insulator material and portions of the barrier layer are then patterned to create one or more trenches which extend from the surface of the insulator material to the semiconductor device. In one aspect of this embodiment, at least one trench is filled with a deuterated material which will serve as a reservoir for deuterium to passivate the device. Additional trenches may be filled with electrically conductive material, and these trenches may extend through the barrier layer, or to circuitry positioned above the barrier layer. In a preferred embodiment, the trench is filled with deuterated silicon nitride; however, deuterated metal hydrides and deuterated refractory metals could be used (e.g., CVD tungsten based materials, such as tungsten, tungsten silicide or tungsten nitride; and similar CVD tantalum or titanium based materials). In general, group 4b and 5b elements or alloys (e.g., $Pd_xAg_{1-x}$) including Ti, Zr, Hr. V, Nb, Ta, Ni, Cu, and Pd (transition metals) form hydrides and have high hydrogen/deuterium solubility. In addition, deuterated amorphous silicon, amorphous carbon, amorphous SiC, amorphous SiGe, $SiO_2$, $Si_3N_4$, phosphorus and/or boron doped $SiO_2$ can act as deuterium reservoirs. In another aspect of this embodiment, at least one trench is lined with a deuterated material which will serve as a reservoir for deuterium to passivate the device. The remainder of the trench is then filled with an electrically conductive material such as tungsten, titanium lined tungsten, tantalum lined copper, or titanium lined aluminum- copper. Towards the end of manufacturing, the semiconductor structure can be placed in an oven and annealed at a temperature sufficient to cause the deuterium in the deuterium reservoirs to diffuse throughout the structure at sections not blocked by the barrier layer. A suitable anneal temperature should range from 300° C. to 800° C., with 400° C. being optimal, and the anneal time will be generally greater than one minute (e.g., approximately thirty minutes). The time and temperature will vary depending on the characteristics of the semiconductor structure.

According to a second embodiment of the invention, one or more ingress paths, are formed through a barrier to permit deuterium diffusion to gate dielectric. The ingress path is then capped with an ion barrier. The ingress paths can be through thin films on the front surface of the wafer or through the silicon from the back. To provide the latter, isolation regions, such as shallow trench isolations, are formed in a semiconductor substrate which includes semiconductor devices and/or circuitry formed on a top surface. The back side of the semiconductor substrate is subjected to grinding and/or polishing or equivalent treatments to remove portions of the substrate in order to expose the bottom of the isolation regions. The isolation regions are adjacent to and connected with semiconductor devices through a deuterium diffusion path, such as $SiO_2$, formed in the semiconductor substrate, and serve as deuterium ingress pathways after the grinding or polishing is performed. Specifically, after grinding or polishing, the bottom of the isolation region is exposed from the back side. Because the isolation region is filled with a material which permits deuterium diffusion therethrough, an anneal in the presence of deuterium gas or deuterium plasma will allow deuterium to diffuse through the back of the isolation regions up to the semiconductor devices formed at the top of the semiconductor substrate. Alternative mechanisms, such as exposure to photon sources including lasers and microwaves, could also be used to enhance deuterium diffusion through the ingress pathways.

BRIEF DESCRIPTION OF THE DRAWINGS

The foregoing and other objects, aspects and advantages will be better understood from the following detailed description of the preferred embodiments of the invention with reference to the drawings, in which.

DETAILED DESCRIPTION OF A PREFERRED EMBODIMENT OF THE INVENTION

In the drawing figures, like elements are denoted by like numerals.

Figure 1A:
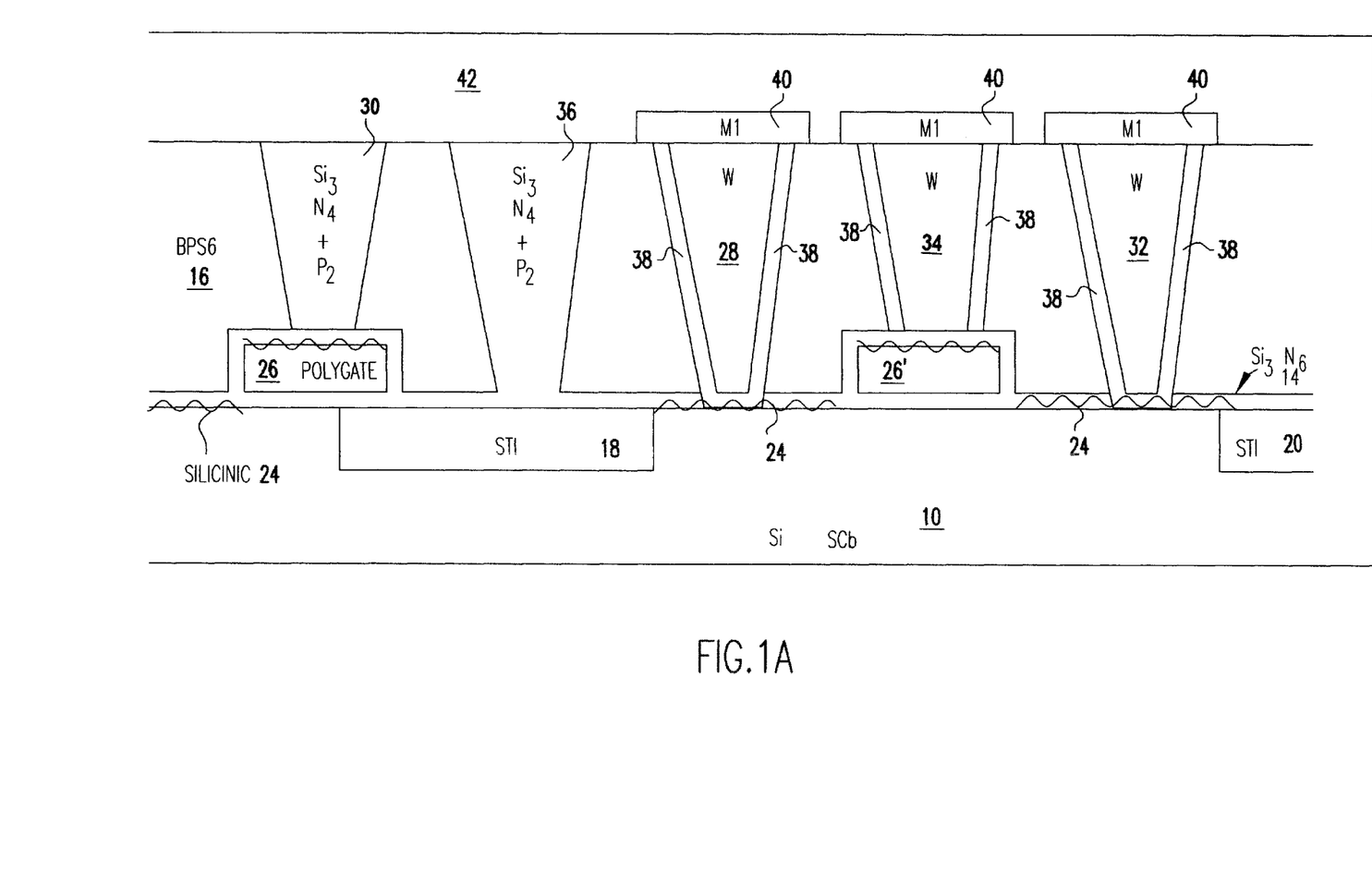
FIGS. 1a–b are cross-sectional side views of a silicon substrate and a silicon-on-insulator (SoI) substrate, respectively, each with a deuterated silicon nitride reservoir plug.

With reference to FIG. 1a, there is shown a semiconductor substrate 10, which is preferably a silicon material but could be any other suitable material, in which one or more semiconductor devices are formed. The nature of the semiconductor devices can vary according to the needs of the manufacturer, and FIG. 1a shows an MOS transistor for exemplary purposes only. The semiconductor substrate 10 and gate electrode are over coated with a barrier layer 14 which serves as a barrier to deuterium diffusion. Examples of suitable materials for the barrier layer 14 include silicon nitride and silicon carbide. The barrier layer is itself overcoated with an insulating material 16 such as borophosphosilicate glass and phosphosilicate glass. The semiconductor substrate 10 has isolation regions such as shallow trench isolations (STIs) 18 and 20, silicide conductors 24, and gate electrodes 26 and 26'. The STIs 18 and 20 can be formed by conventional methods (e.g., lithography, etching, deposition, and chemical-mechanical polishing), and can be filled with silicon dioxide or other materials. The gate electrodes 26 and 26' can be metal or polysilicon or other suitable materials which can be deposited and patterned using conventional techniques or damascene techniques. The silicide conductors 24 can be cobalt silicide, titanium silicide, or other suitable materials.

The insulating material 16 is patterned to provide trenches which extend to specific regions of the semiconductor substrate 10. FIG. 1a shows three conductive material filled trenches 28, 30 and 32 and two deuterated solid material filled trenches 34 and 36; however, the number of trenches can vary considerably depending on the semiconductor devices formed in the substrate 10 and the needs of the manufacturer. In FIG. 1a, three of the trenches, 28, 32, and 36 extend through the barrier layer 14 to the surface of the substrate 10, and two of the trenches, 30 and 34, extend to the gate electrodes 26 and 26'. The trenches can be formed by conventional methodologies such as those which employ lithography and etching. An important feature of this invention is that at least one of the trenches (e.g., trench 36) which extends through the barrier layer 14 is filled with a deuterated solid material. The deuterated solid material may be deuterated silicon nitride (as is shown in FIG. 1a), deuterated silicon carbide, deuterated silicon dioxide, deuterated metal hydrides, or deuterated refractory metals such as CVD tungsten, tantalum or titanium based materials as discussed previously. The amount of deuterium in the deuterated solid material can vary considerably, but should be sufficient to serve as a reservoir to provide enough deuterium for passivation purposes. In the example shown in FIG. 1a, passivation occurs at the silicon interface under the gate 26; however, it will be understood by those of skill in the art that passivation will also occur at the silicon interface under gate 26' by way of another shallow trench isolation not shown in the schematic drawing. A preferred deuterated silicon nitride plug, such as that shown in trenches 30 and 36, includes 10–20 atomic percent deuterium. The passivation results when the semiconductor structure is annealed or otherwise subjected to an energy source, such as laser exposure, which causes the deuterium to diffuse through the STI oxide 18 to the silicon interfaces of the semiconductor device under gate 26. If annealing is employed, a preferred temperature range is 300° C. to 800° C., and most preferably 400° C. Exposure to plasma during the anneal may accelerate diffusion. When gate 26 is polysilicon, as is shown in FIG. 1a, some deuterium diffusion through the gate will occur during annealing; therefore, the silicon nitride plug in trench 30 can also be employed as a source of deuterium for passivation purposes with the pathway extending through the gate 26.

As shown in FIG. 1a, trenches 28, 34, and 32 are filled with a conductive material such as tungsten. In this instance, the walls of the trenches are lined with titanium 38. The conductive materials which can be employed include aluminum, copper, and tungsten, as well as many other materials. It should be understood that the choice of conductive material will depend on the semiconductor device 12 and the needs of the manufacturer. The trenches 28, 34, and 32 provide a conductive pathway to metallization 40, which might comprise first level wiring which will be interconnected to upper levels of wiring and vias in upper region 42 of the device.

Figure 1B:
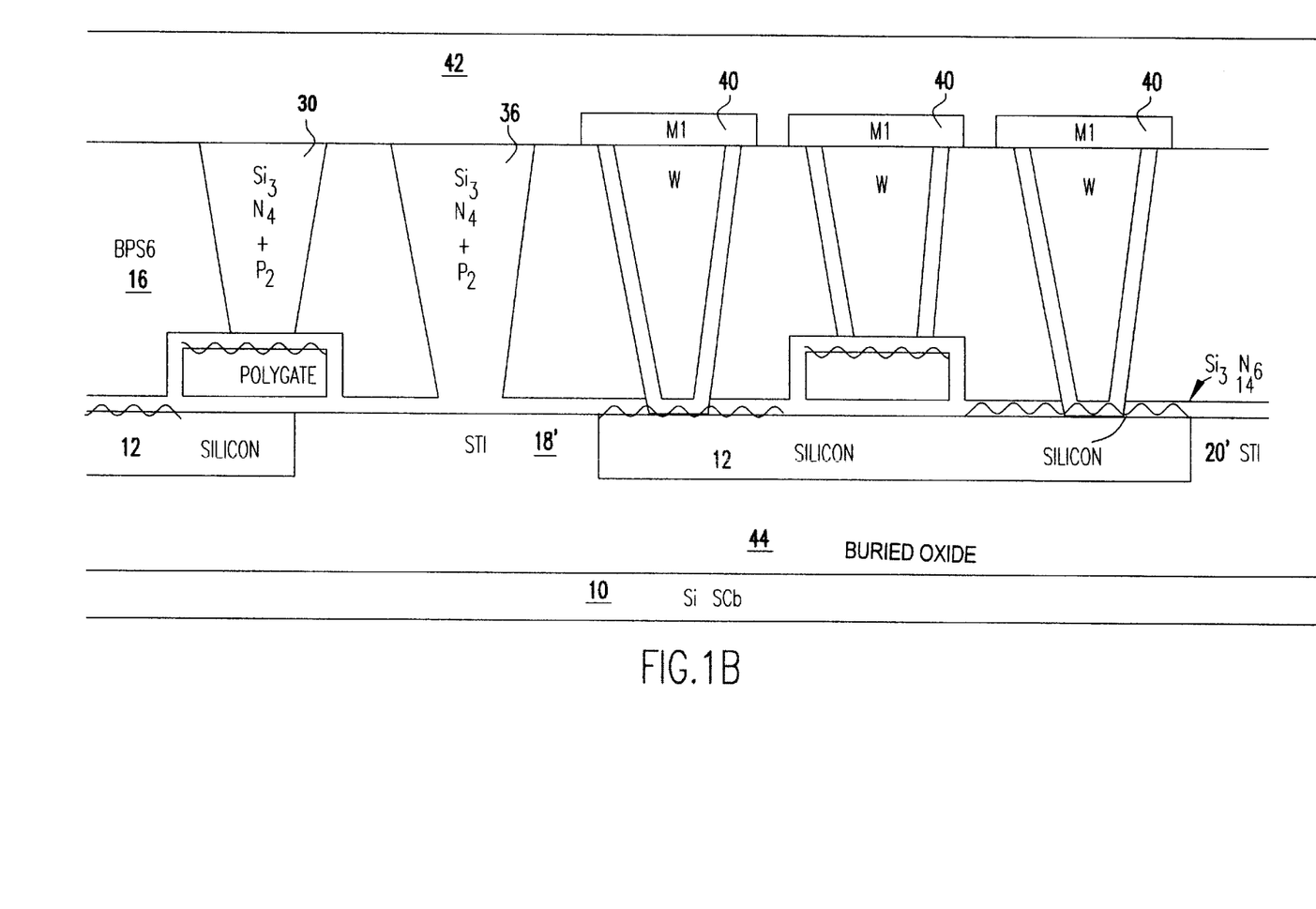

FIG. 1b illustrates a similar design to that shown in FIG. 1a; however, the substrate is an SOI device comprised of a silicon substrate 10, a buried oxide layer 44, and a silicon layer 12 on top of the buried oxide layer 44. The STIs 18' and 20' isolate the silicon layer 12 and adjoin the buried oxide layer 44. In the device shown in FIG. 1a, deuterium diffusion only occurs through ingress path 34 and polysilicon gate 26 or, to a larger extent, through ingress path 36 and STI 18. Dueterium does not diffuse appreciably through the silicon substrate 10. In the SOI device of FIG. 1b, the buried oxide layer 44 provides an additional deuterium diffusion path which extends from the dummy deuterated silicon nitride filled trench 36, through STI 18', into buried oxide layer 44, and up through other STIs such as 20'.

Figure 2A:
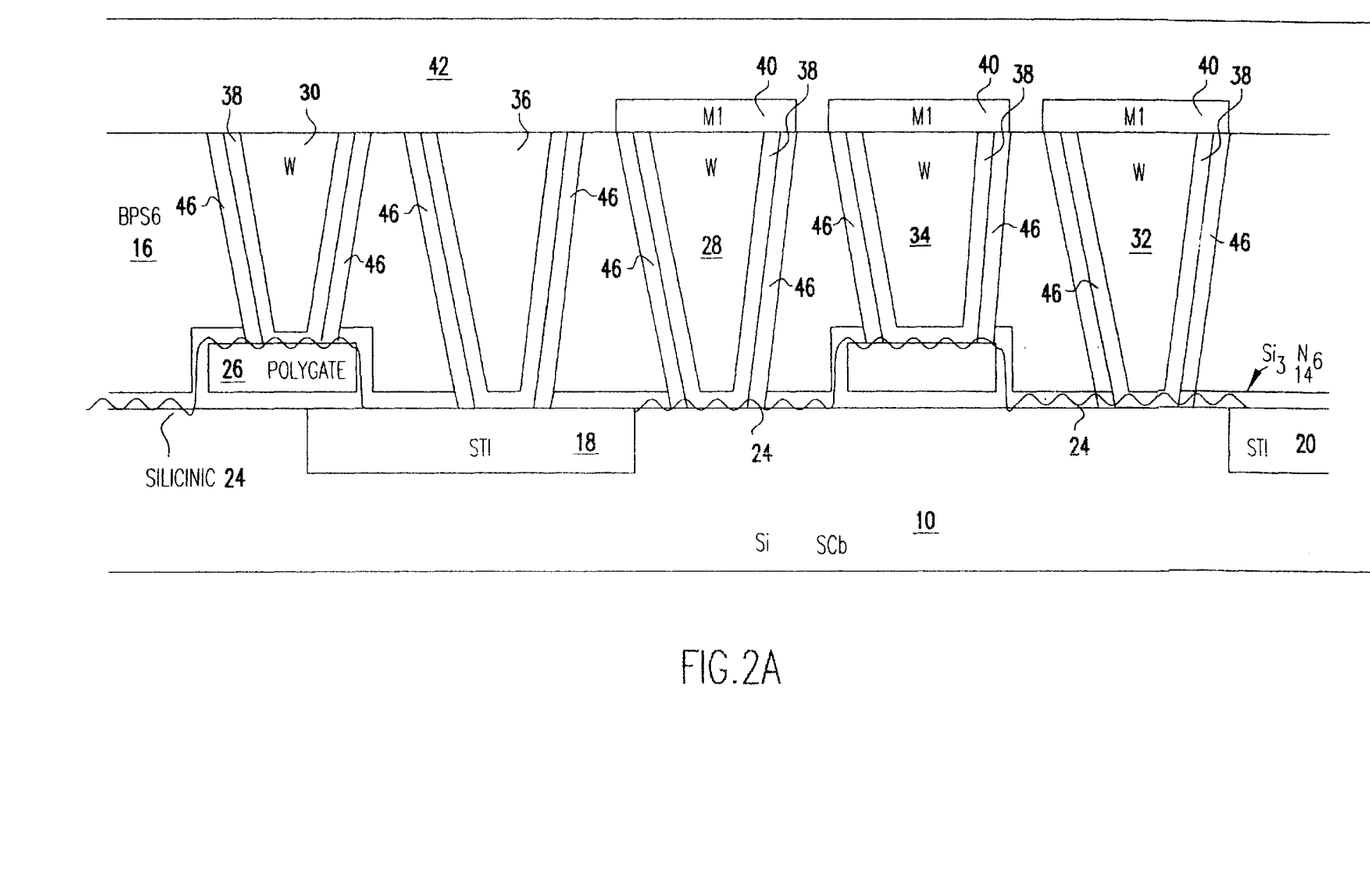
FIGS. 2a–b are cross-sectional side views of a silicon substrate and an SOI substrate, respectively, each with tungsten plugs inside openings lined with deuterated silicon nitride.
Figure 2B:
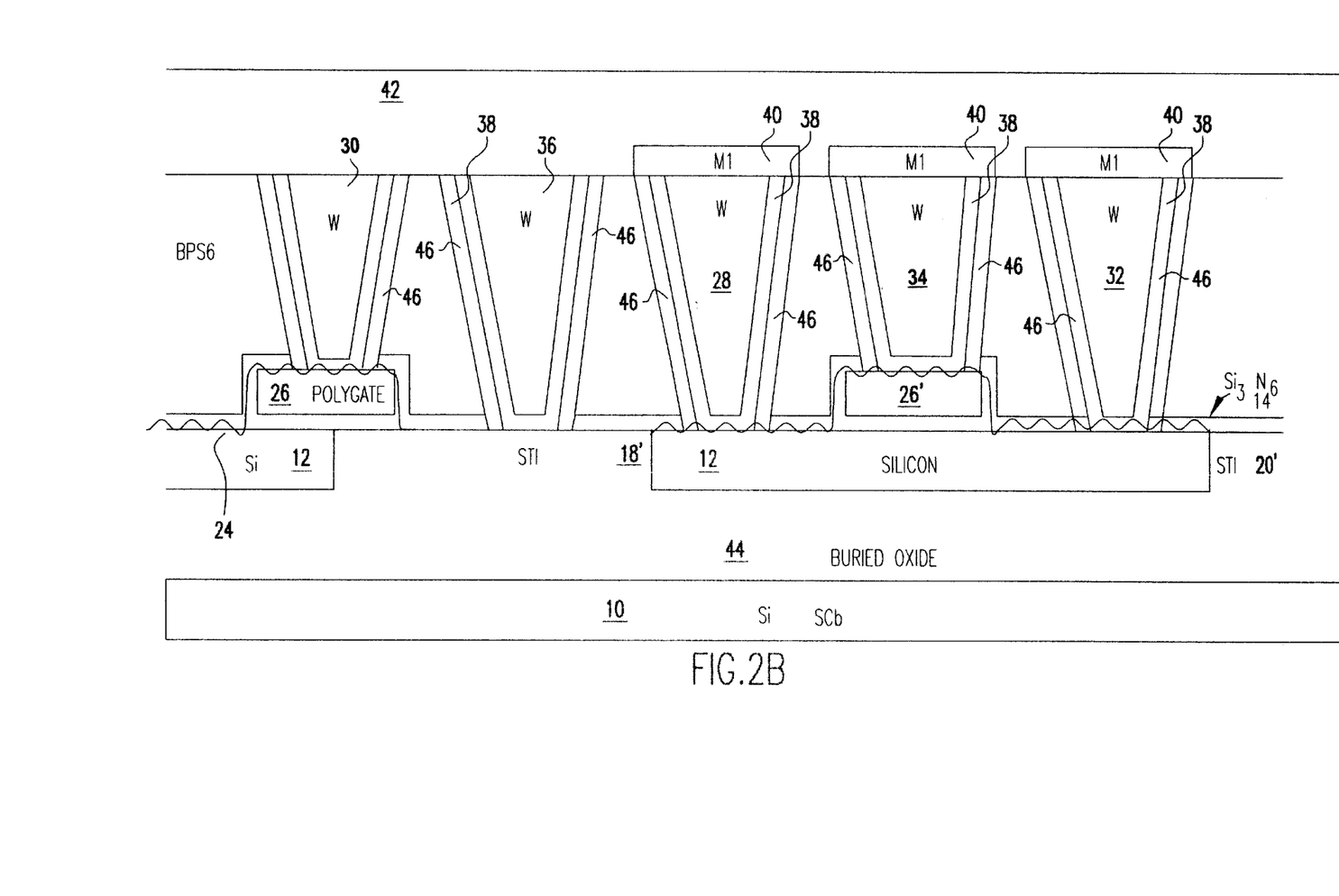

FIG. 2a–b show another aspect of the invention shown, and similar numbering has been used to denote similar structures. The chief difference between FIGS. 2a–b and FIGS. 1a–b, is that each of the trenches are lined with a deuterated material 46. Unlike the examples of FIGS. 1a–b, all of the trenches can serve as electrically conductive pathways, and silicon nitride filled dummy trenches are not required in the Example of FIGS. 2a–b.

The deuterated material preferably has a thickness ranging from 5–100 nm, and most preferably is approximately 10 nm. The deuterated material 46 can be any of those mentioned above, but is most preferably deuterated silicon, deuterated carbon, deuterated silicon nitride, deuterated silicon carbide, or deuterated metals (e.g., CVD aluminum, tungsten or titanium). Conformal coating of the trench walls with the deuterated material can be accomplished by many conventional techniques including low pressure chemical vapor deposition (LPCVD), physical vapor deposition (PVD), plasma enhance chemical vapor deposition (PECVD), or high density plasma chemical vapor deposition (HPCVD). After deposition, the dielectric at the bottom is removed by a spacer etchback (i.e., an anisotropic direction etch which leaves dielectric on the trench sidewalls). As with FIGS. 1a–b, the semiconductor structure shown in FIGS. 2a–b shows the deuterated material 46 extending through the barrier layer 14 in certain regions so that it may serve as a reservoir for deuterium passivation of the semiconductor devices in substrate 10 during a subsequent anneal or alternative treatment which causes deuterium diffusion. As discussed above, the anneal or alternative treatment causes the deuterium to difffuse to the surfaces of the silicon through the STI 18 (as well as other STI's), and, with reference to FIG. 2b, in the SOI configuration, the deuterium also diffuses through the buried oxide layer 44 to the silicon surfaces where passivation is needed. In the case where the trenches 28, 30, 32, 34, and 36 are filled with tungsten, a titanium layer 38 can be created over the deuterated material 46 before filling with tungsten. As discussed above, other conductive materials may also be used to fill the trenches.

Figure 3A:
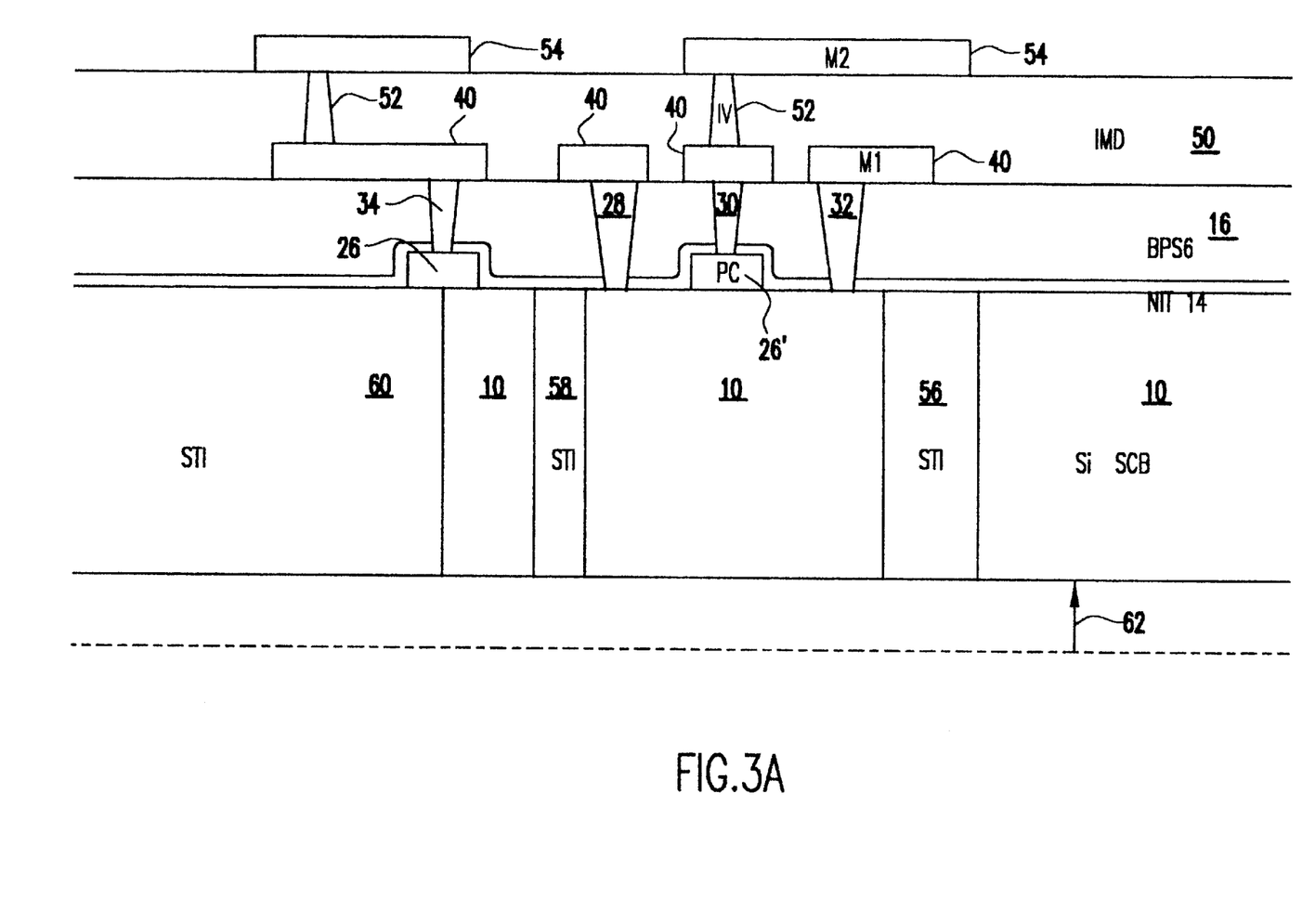
FIGS. 3a–b are cross-sectional side views of a silicon substrate and an SOI substrate, respectively, each with deuterium ingress pathways extending from a bottom of the substrate.
Figure 3B:
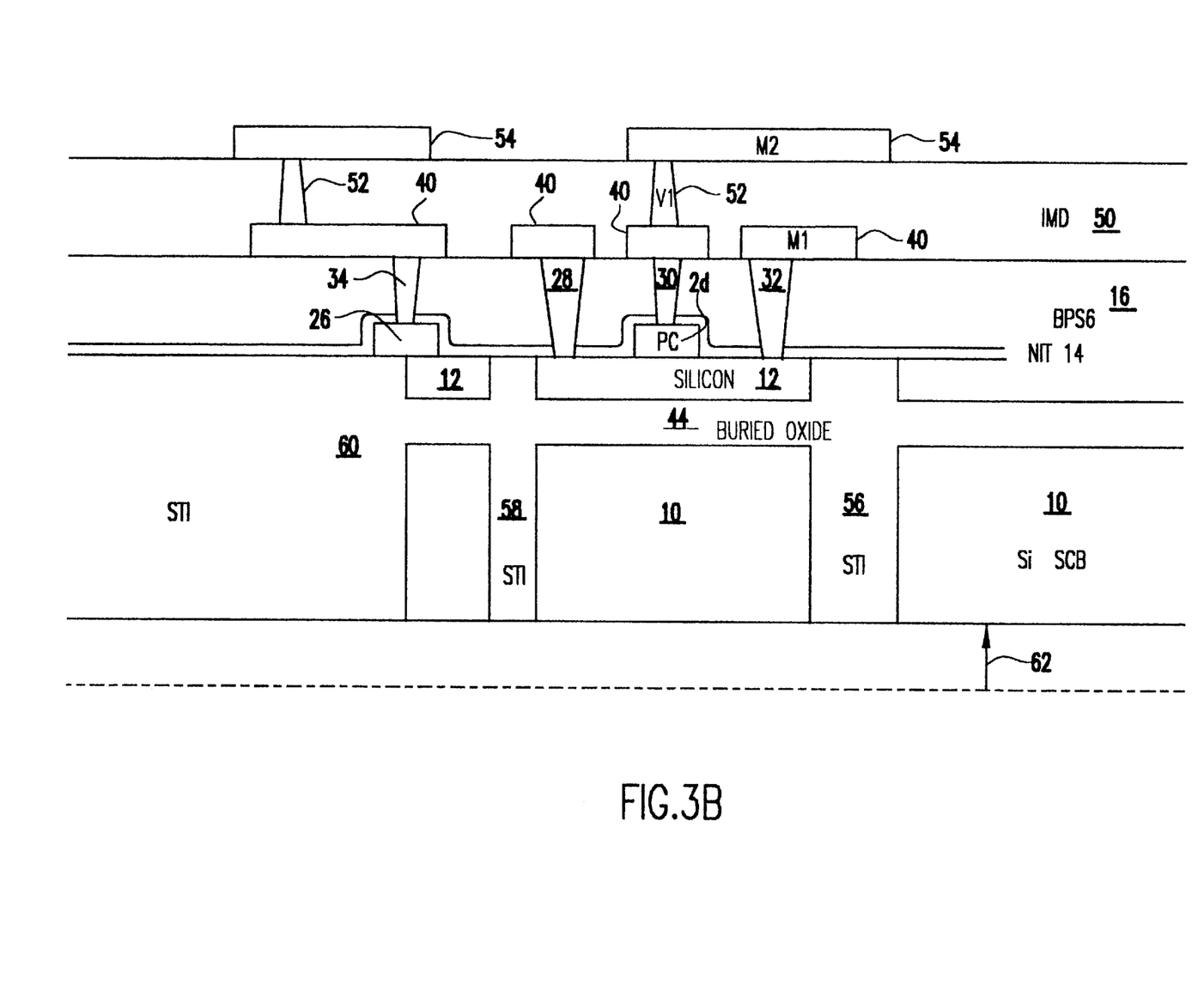

FIGS. 3a–b show another alternative embodiment of this invention, where the semiconductor substrate is provided with ingress pathways which provide for deuterium passivation to semiconductor devices. The substrate with CMOS devices and two levels of wiring of FIGS. 3a–b are shown for exemplary purposes only, and can be varied within the practice of this invention depending on the needs of the manufacturer. In particular, multiple layers can be positioned on top of the insulator layer 16. For exemplary purposes only, FIGS. 3a–b each show one intermetallic dielectric layer 50 positioned over the metallization 40, where conductive vias 52 electrically connect the metallization 40 to a second level metallization 54.

In FIGS. 3a–b, the vias 28, 30, 32 and 34 are filled with an electrically conductive material and do not serve as a deuterium reservoir. However, it should be understood that any of the deuterium pathway configurations shown in FIGS. 1–4 could be practiced together in the same substrate.

In FIGS. 3a–b, deuterium ingress regions 56, 58, and 60 extend through the substrate 10 (substrate 10, buried oxide 44 and silicon 12 in the case of an SOI as shown in FIG. 3b). These ingress regions can be formed as shallow trench isolations or other suitable structures, and are preferably filled with oxides, such as silicon dioxide or boron or phosphorus doped silicon dioxide, or other suitable materials which allow for diffusion of deuterium therethrough. Deuterated amorphous silicon, amorphous carbon, amorphous SiC, and amorphous SiGe can also provide ingress paths. Trenches several micrometers deep can be formed from the front of the wafer using a process well known in the art for forming deep trench capacitors such as are commonly used in DRAM chips. The deuterium ingress regions 56, 58, and 60, can be created using conventional lithography and silicon etching, deposition, and chemical-mechanical polishing techniques, or by other suitable means. However, if conventional mechanisms are used, the deuterium ingress regions 56, 58, and 60 would not extend through the substrate 10. Preferably the trenches are about 20 micrometers deep. This necessitates polishing, grinding, or otherwise removing portions of the substrate 10 from the back of the wafer to expose the bottom of the deuterium ingress pathways. The wafer is mounted on a front side carrier (not shown) to provide support once the wafer has been thinned. The carrier is formed of a material such as silicon, alumina, or a polymer, such as polyimide, and has a thickness in the range from 50 micrometers to 250 micrometers. It has perforations to enable contacting pads of chips on the front side of the wafer. It is attached to the wafer with solder or a high temperature inorganic adhesive, such as Thermid, that can withstand the deuterium anneal temperature. Wafer thinning by grinding is illustrated by the dashed lines and arrow 62.

As best seen in FIGS. 3a–b, the deuterium ingress pathway 60 is adjacent and connected to the semiconductor device under gate 26, such that upon annealing in the presence of deuterium gas or deuterium plasma, deuterium diffuses up through the back side via the pathway 60 to passivate the silicon under the gate 26. With reference to FIG. 3b, it can be seen in the SOI configuration, deuterium can also diffuse to the passivation region through the buried oxide layer 44. However, it will be understood by those of skill in the art that deuterium ingress pathways 58 and 56 would preferably be used to passivate other semiconductor devices in the substrate, and that gate 26' would receive passivation through yet another deuterium ingress pathway.

Figure 4A:
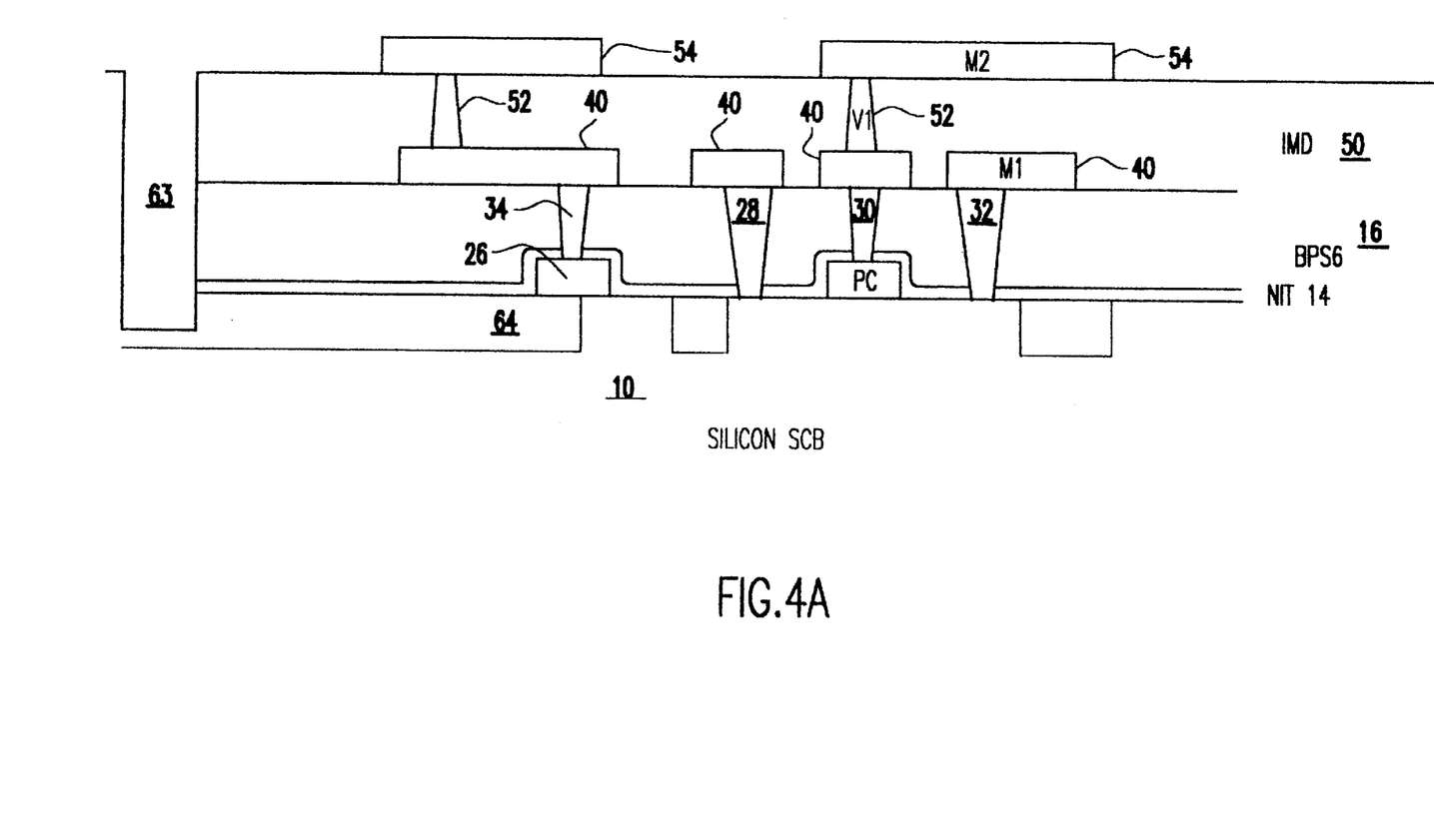
FIGS. 4a–b are cross-sectional side views of a silicon substrate and an SOI substrate, respectively, each with deuterium ingress pathways extending from a top of the substrate.
Figure 4B:
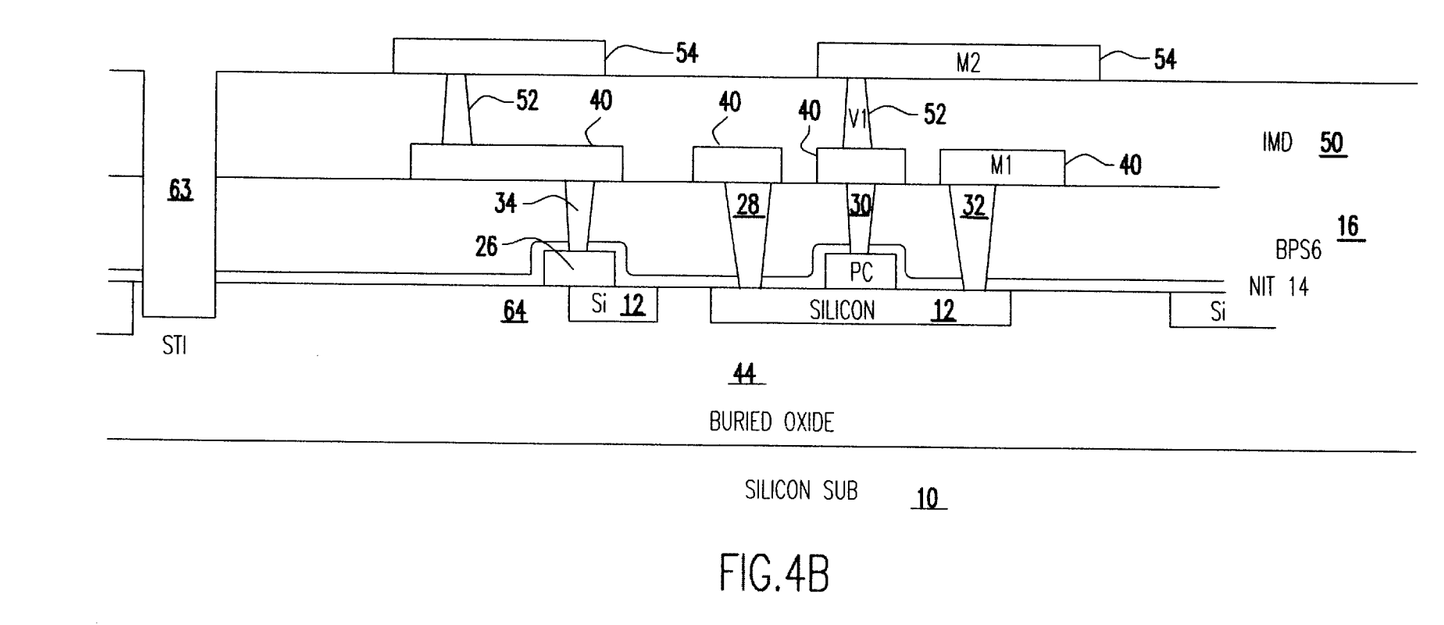

FIGS. 4a–b show an alternative configuration to that shown in FIGS. 3a–b where the deuterium ingress pathway 63 is formed in the top of the device, as opposed to the bottom of the substrate. In FIG. 4a, the deuterium ingress pathway 63 is created in a region that is adjacent and connected to a shallow trench isolation 64 position ed under gate 26 by etching the trenches down to the STI 64. Upon annealing in the presence of deuterium gas or deuterium plasma, deuterium diffuses down through the pathway 63, and through STI 64 to passivate the silicon under the gate 26. With reference to FIG. 4b, it can be seen in the SOI configuration, deuterium can also diffuse to the passivation region through the buried oxide layer 44. The deuterium ingress pathway 63 is needed because the chip has one or more deuterium diffusion barriers, such as silicon nitride layer 14 over the gate 26. In addition, the upper layer of metal is generally coated with a silicon nitride mobile ion barrier that would also prevent deuterium penetration.

With respect to each of FIGS. 3a–b and 4a–b, after the deuterium anneals, the exposed openings preferably would be passivated with a mobile ion barrier, such as $Si_3N_4$, or a standard dielectric, such as $SiO_2$ phosphorus doped $SiO_2$, or polyimide, etc. Although $Si_3N_4$ can be deposited between room temperature and 50° C., it is preferably deposited at a temperatue below 25° C. to prevent hydrogen and deuterium diffusion that can degrade the gate dielectric passivation.

While the invention has been described in terms of its preferred embodiments, those skilled in the art will recognize that the invention can be practiced with modification within the spirit and scope of the appended claims.

We claim:

1. A semiconductor structure, comprising:
   a semiconductor substrate including at least one semiconductor device;
   a barrier layer that provides a barrier to deuterium diffusion extending over or under said semiconductor device; and
   a trench containing a deuterated solid material extending through said barrier layer, said deuterium containing solid material providing a source of deuterium for said semiconductor device.

2. The semiconductor structure of claim 1 wherein said barrier layer is silicon nitride.

3. The semiconductor structure of claim 1 wherein said barrier layer is silicon carbide.

4. The semiconductor structure of claim 1 wherein said deuterated solid material is deuterated silicon nitride.

5. The semiconductor structure of claim 1 wherein said deuterated solid material comprises a deuterated metal.

6. The semiconductor structure of claim 5 wherein said deuterated metal comprises one from the group comprising Ti, Zr, Hf, V, Nb, Ta, Ni, Cr, Cu, Pd, Y, Eu, and Ag.

7. The semiconductor structure of claim 1 wherein said deuterated solid material is a deuterated semiconductor.

8. The semiconductor structure of claim 1 wherein said deuterated solid material comprises amorphous silicon, amorphous silicon carbide, amorphous silicon germanium, amorphous carbon, or semicrystalline carbon.

9. The semiconductor structure of claim 1 wherein said deuterated solid material fills said trench.

10. The semiconductor structure of claim 1 wherein said deuterated solid material lines the sidewalls and not the bottom of said trench, and wherein said trench is filled with an electrically conductive material.

11. The semiconductor structure of claim 1 wherein said device comprises a gate and wherein said trench is laterally spaced from said gate.

12. A semiconductor structure comprising:
   a semiconductor device formed in a substrate, said semiconductor device having at least one silicon interface passivated by deuterium;
   a barrier to the diffusion of deuterium to said semiconductor device except at said at least one silicon interface;
   an ingress path which extends through said barrier to permit deuterium diffusion during a process step to said silicon interface; and
   a layer positioned on said ingress path to stop mobile ions from penetrating to said silicon interface along said ingress path after said deuterium diffusion process step.

13. The semiconductor structure of claim 12 wherein said at least one ingress path extends downward from a top of said semiconductor structure.

14. The semiconductor structure of claim 12 wherein said ingress path extends upward from a base of said semiconductor structure.

15. The semiconductor structure of claim 12 wherein said ingress path comprises a silicon oxide.

16. The semiconductor structure of claim 15 wherein said oxide comprises a back insulator of a silicon-on-insulator structure.

17. The semiconductor structure of claim 15 wherein said oxide comprises a shallow trench isolation.

18. The semiconductor structure of claim 15 wherein said oxide comprises a boron or phosphorus doped silicon dioxide.

19. The semiconductor structure of claim 12 wherein said device comprises a gate and wherein said ingress path is laterally spaced from said gate.

20. An electric structure, comprising:
   a substrate;
   a dielectric layer on said substrate, said dielectric layer formed of a first dielectric material;
   a damascene trench in said dielectric layer, said trench comprising sidewalls and a bottom surface;
   a dielectric spacer lining said trench sidewalls but not lining said bottom surface, said spacer formed of a second dielectric material different from said first dielectric material and comprises a deuterated material; and
   a damascene conductor on said dielectric spacer and on said bottom surface.

* * * * *